US008406434B2

(12) United States Patent
Shih et al.

(10) Patent No.: US 8,406,434 B2

(45) Date of Patent: Mar. 26, 2013

(54) AUDIO PROCESSING SYSTEM

(75) Inventors: Cheng-Ming Shih, Taipei (TW); Cheng-Lin Chen, Taipei (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 1241 days.

(21) Appl. No.: 11/892,484

(22) Filed: Aug. 23, 2007

(65) Prior Publication Data

US 2008/0212802 A1 Sep. 4, 2008

(30) Foreign Application Priority Data

Mar. 1, 2007 (TW) ............................... 96106959 A

(51) Int. Cl.
*H03G 3/00* (2006.01)

(52) U.S. Cl. ........................................................ 381/108

(58) Field of Classification Search .......... 381/104–108, 381/120, 121
See application file for complete search history.

(56) References Cited

U.S. PATENT DOCUMENTS

| | | | | |
|---|---|---|---|---|
| 6,625,277 | B1 * | 9/2003 | Furlong | 379/388.03 |
| 7,106,839 | B2 * | 9/2006 | Davis | 379/93.02 |
| 7,336,130 | B2 * | 2/2008 | Takahata | 330/284 |
| 2003/0081976 | A1 * | 5/2003 | Monney et al. | 400/472 |
| 2006/0075168 | A1 * | 4/2006 | Warren et al. | 710/65 |
| 2008/0123873 | A1 * | 5/2008 | Bjorn-Josefsen et al. | 381/106 |

* cited by examiner

*Primary Examiner* — Alexander Jamal

(74) *Attorney, Agent, or Firm* — Muncy, Geissler, Olds & Lowe, PLLC

(57) ABSTRACT

The audio processing system disclosed in the invention comprises an audio processor and an audio amplifier. The audio processor receives a data signal to generate a processed signal, and comprises at least one gain control circuit and at least one operational amplifier. The gain control circuit generates a gain signal according to a volume control signal, a reference signal, and a feedback signal. The operational amplifier couples to the gain control circuit and amplifies the data signal by the gain signal to generate a processed signal. The audio amplifier couples to the audio processor to receive and amplify the processed signal, wherein an amplified signal is generated.

12 Claims, 3 Drawing Sheets

AUDIO PROCESSING SYSTEM

BACKGROUND OF THE INVENTION

1. Field of the Invention

The invention relates to audio processing systems and particularly to audio processing systems with USB controllers.

2. Description of the Related Art

In general, a USB control chip is utilized in personal computers to play voice or music data by external audio processing systems. The USB control chip controls a USB controller to transmit voice or music data from the personal computer to the external audio processing system via a USB connection port. In conventional techniques, an audio processing control chip is required to control the external audio processing system to process the received voice and music data. The processed voice and music data is lastly played by a loudspeaker. The conventional technique of playing voice or music data stored in a personal computer, however, requires two separate control chips, the USB control chip and the audio processing control chip, that occupy a large circuit area. An important topic for those skilled in the Art is reducing overall size of the circuit.

Because the current market trend is towards smaller sized products, it is desirable to develop smaller sized and more efficient audio processing systems.

BRIEF SUMMARY OF THE INVENTION

The invention provides audio processing systems integrating a USB interface with the audio amplifier.

In an embodiment of the invention, an audio processing system is disclosed and comprises an audio processor and an audio amplifier. The audio processor comprises at least one gain control circuit and at least one operational amplifier, and receives a data signal to generate a processed signal. The gain control circuit generates a gain signal according to a volume control signal and a reference signal. The operational amplifier couples to the gain control circuit, and amplifies the data signal by the gain signal to generate the processed signal. The audio amplifier couples to the audio processor, and amplifies the processed signal to generate an amplified signal.

In some embodiments, the audio processing system further comprises at least one loudspeaker. The amplified signal is transmitted to the loudspeaker and played by the loudspeaker.

The above and other advantages will become more apparent with reference to the following description taken in conjunction with the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
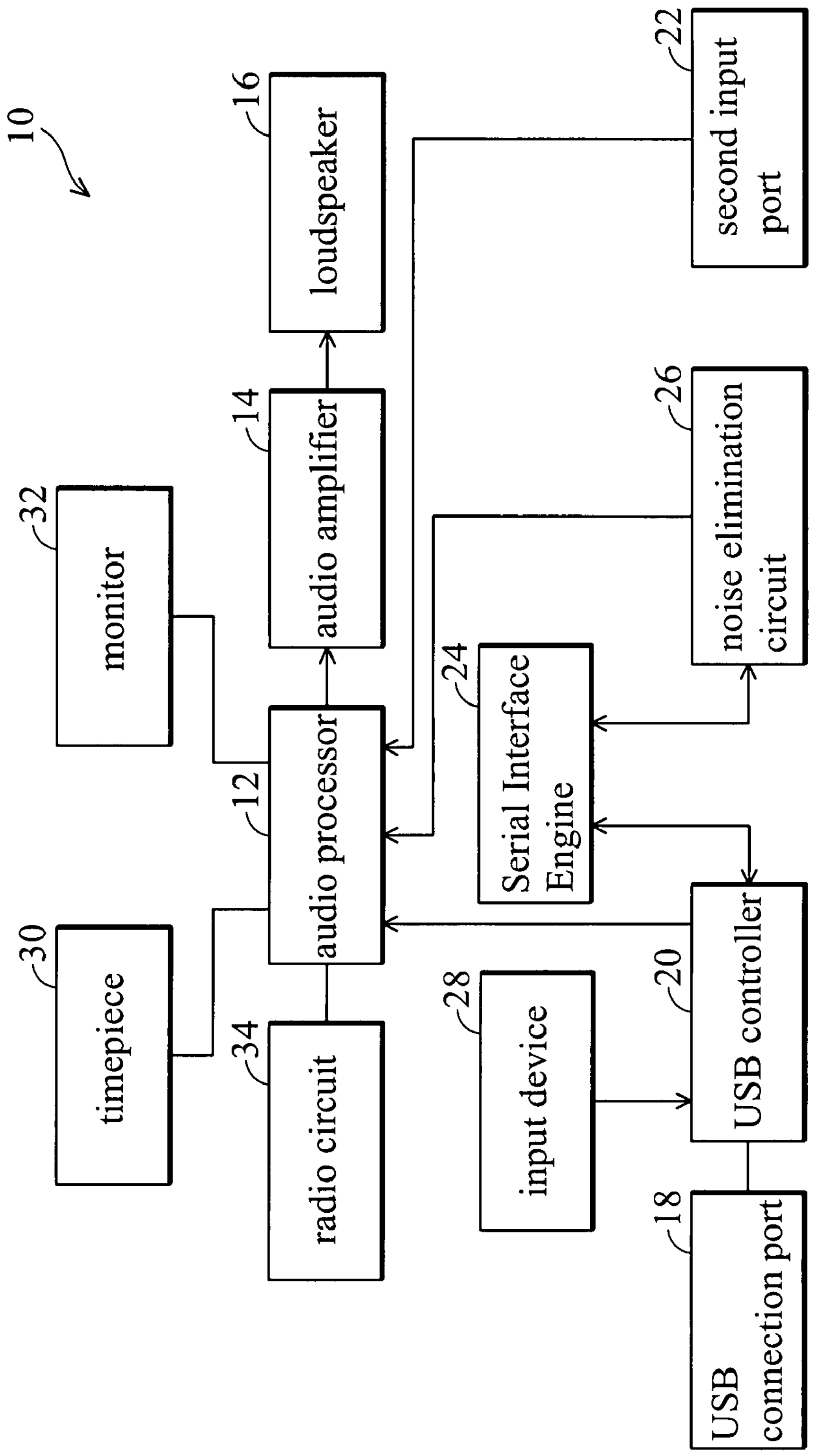
FIG. 1 shows an embodiment of the audio processing system of the invention.

FIG. 1 shows an embodiment of the audio processing system of the invention. The audio processing system 10 comprises an audio processor 12 and an audio amplifier 14. The audio processor 12 receives a data signal and processes the data signal to generate a processed signal. The audio amplifier 14 couples to the audio processor 12 to receive the processed signal and to amplify the processed signal to generate an amplified signal. In some embodiments, the audio processing system 10 further comprises a loudspeaker 16 coupling to the audio amplifier 14 to receive the amplified signal. The amplified signal is displayed by the loudspeaker 16.

Figure 2:
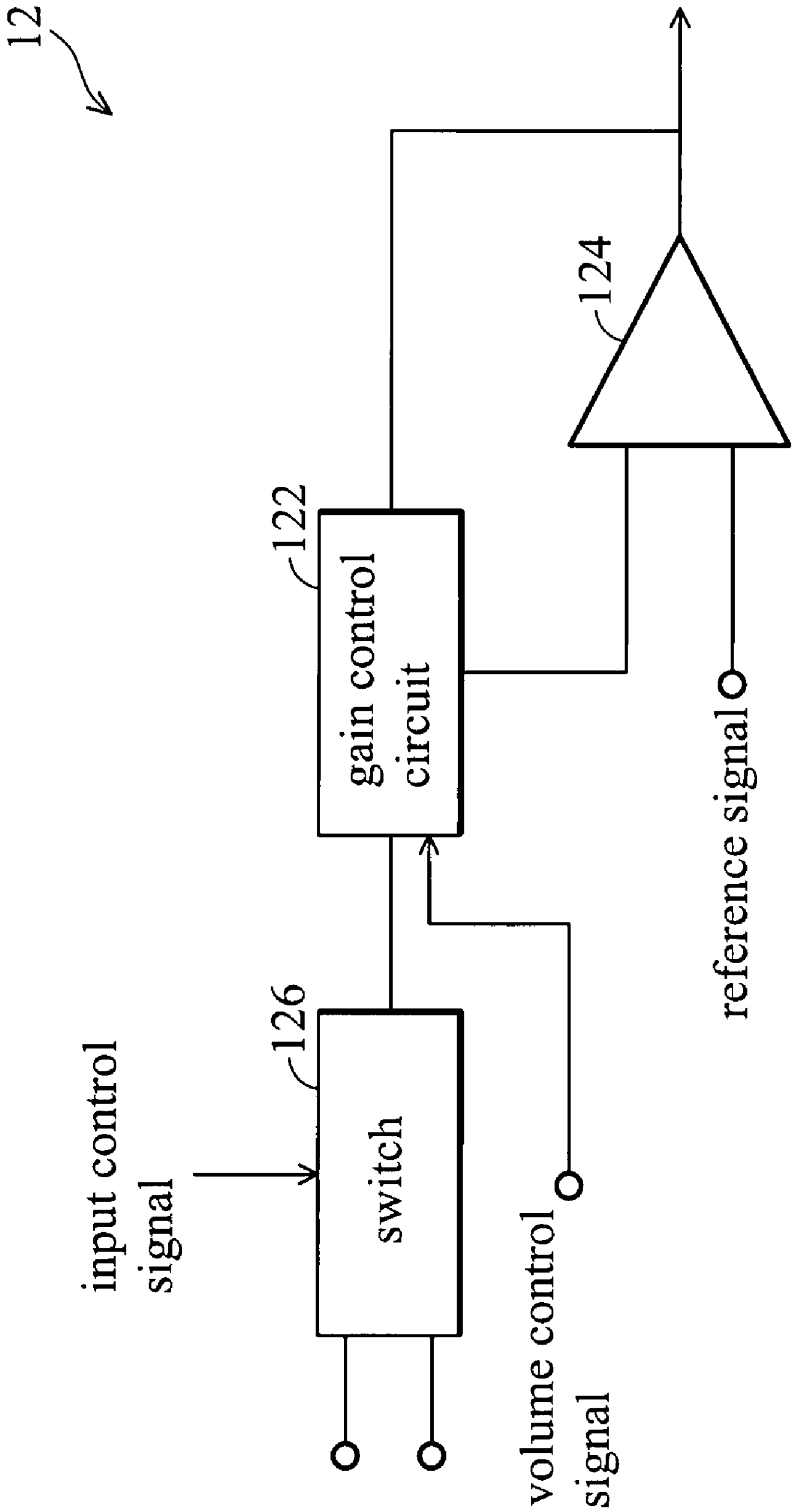
FIG. 2 shows an embodiment of the audio processor of the invention.

FIG. 2 shows an embodiment of the audio processor of the invention. The audio processor 12 comprises at least one gain control circuit 122 and at least one operational amplifier 124. The gain control circuit 122 generates a gain signal according to a volume control signal, a reference signal, and a feedback signal. The operational amplifier 124 couples to the gain control circuit 122, and amplifies the reference signal by the gain signal to generate the operated signal. The operated signal is fed back to the gain control circuit as the feedback signal. The reference signal may be the data signal or a reference voltage level. The operational amplifier 124 may be implemented by a differential amplifier.

Referring to FIG. 1, in some embodiments of the invention, the audio processing system 10 further comprises a USB connection port 18 and a USB controller 20. The USB connection port 18 receives an audio signal. The USB controller 20 couples to the USB connection port 18 and the audio processor 12 to receive the audio signal and to generate the data signal. In some embodiments, the audio processing system 10 further comprises a second input port 22 coupling to the audio processor 12. The data signal may be inputted to the audio processing system via the second input port 22.

In some embodiments, the audio processing system 10 further comprises an input device 28 coupling to the USB controller 20. The volume control signal is inputted to the system by the input device 28. The input device 28 may be a keyboard, a faceplate of a keyboard, or a remote control. Referring to FIG. 1, the audio processing system further comprises a Serial Interface Engine (SIE) 24 coupling to the USB controller 20. The SIE 24 decodes the audio signal and converts the received data from a serial form to a parallel form. The SIE 24 further converts the transmitted data from the parallel form to the serial form, and encodes the transmitted data. In transmitting/receiving data, the SIE 24 checks the data by a Cyclic Redundancy Check Code.

Referring to FIG. 1, in some embodiments, the audio processing system 10 further comprises a noise elimination circuit 26 coupling to the SIE 24. The noise elimination circuit 26 comprises a flip-flop (not shown in FIG. 1) and at least one digital-analog converter (not shown in FIG. 1). The noise of the audio processing system 10 is eliminated by an external capacitor, the flip-flop and the digital-to-analog converter. The method of eliminating the noise of the system may be implemented by conventional noise elimination techniques.

Referring to FIG. 2, in some embodiments, the audio processor 12 further comprises at least one switch 126 that selectively couples the gain control circuit 122 to the noise elimination circuit 26 or the second input port 22 according to an input control signal. The data signal may be received by the USB connection port 18 or the second input port 22. When the switch 126 switches, pulse occurs in the signals transmitted in the system and the loudspeaker 16 outputs noise sounds pop-pop. The noise elimination circuit 26 eliminates the noise.

In some embodiments, the audio amplifier 14 is implemented by a Class-D amplifier, which comprises a positive input terminal and a negative input terminal. The positive input terminal receives a sawtooth wave, and the negative input terminal receives the operated signal. The audio amplifier 14 generates the amplified signal by amplifying the processed signal according to the sawtooth wave. The Class-D amplifier is a conventional technique and is familiar to those skilled in the Art.

Referring to FIG. 1, in some embodiments, the audio processing system 10 further comprises a timepiece 30 coupling to the audio processor 12 to count time. In some embodiments, the audio processing system 10 further comprises a monitor 32 coupling to the audio processor 12 and the timepiece 30. The monitor 32 displays the data being processed by the audio processing system 10, the processed data, and the result of time counting. Users can monitor the status of the audio processing system 10 from the data displayed by the monitor 32.

Referring to FIG. 1, in some embodiments, the audio processing system 10 further comprises a radio circuit 34 coupling to the audio processor 12. The data received by the radio circuit 34 is Frequency Modulation (FM) signal. In such embodiments, in addition to receiving data and commands, the input device 28 sets the channel of the radio circuit 34 and controls the volume of the loudspeaker 16.

Figure 3:
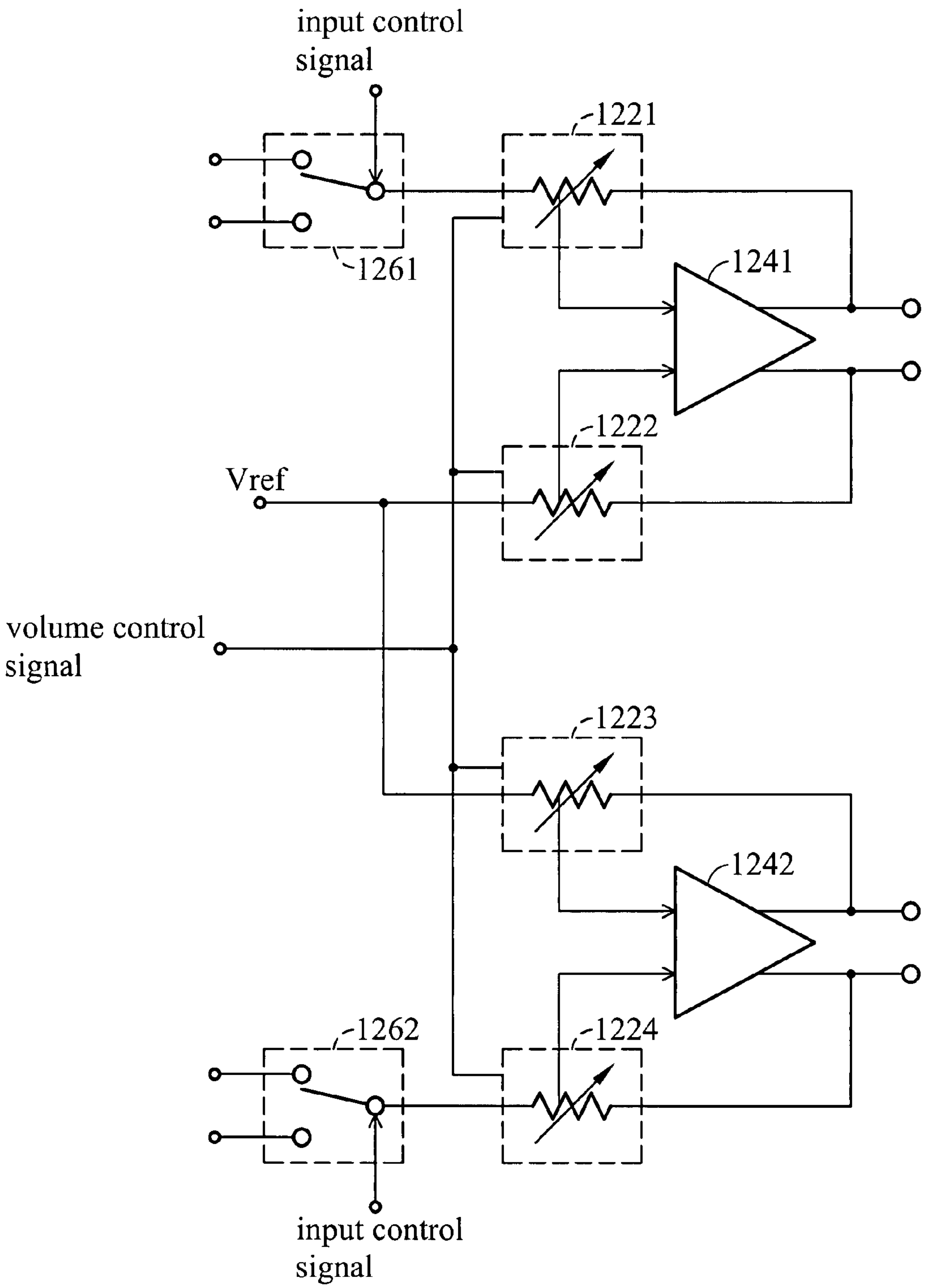
FIG. 3 shows another embodiment of the audio processor of the invention.

FIG. 3 shows another embodiment of the audio processor of the invention. There are two differential amplifiers 1241 and 1242, two switches 1261 and 1262, and four gain control circuits 1221~1224. The differential operational amplifiers 1241 and 1242 generate processed signals for a left channel and a right channel, respectively. The processed signals are transmitted to and amplified by the Class-D audio amplifier 14. The amplified processed signals are outputted by the loudspeaker 16 as the left and right channels. The data signal is coupled to the gain control circuits 1221 and 1224 as the reference signal. A reference voltage Vref is coupled to the gain control circuits 1222 and 1223 as the reference signal. Such design ensures the two differential operational amplifiers 1241 and 1242 of being matched.

In some embodiments, the audio processing system of the invention integrates the circuits of the USB controller and the audio amplifier to reduce the circuit area. In some other embodiments, the audio processing system of the invention comprises a switch for selectively coupling the audio processor to a USB connection port or a second input port. When the switch couples the audio processor to the USB connection port controlled by the USB controller, the audio signal provided by a personal computer is inputted to the audio processing system via the USB connection port. When the switch couples the audio processor to the second input port, the audio signal is inputted to the audio processing system via the second input port directly. In addition to a reduced circuit size, the invention further provides multi-function audio processing systems.

While the invention has been described by way of example and in terms of embodiments, it is to be understood that the invention is not limited thereto. To the contrary, it is intended to cover various modifications and similar arrangements (as would be apparent to those skilled in the Art). Therefore, the scope of the appended claims should be accorded to the broadest interpretation so as to encompass all such modifications and similar arrangements.

What is claimed is:

1. An audio processing system, comprising:

an audio processor, receiving a data signal, and processing the data signal to generate a processed signal, wherein the audio processor comprises:

at least one gain control circuit, generating a gain signal according to a volume control signal, a reference signal, and a feedback signal; and at least one operational amplifier, coupling to the gain control circuit, and amplifying the data signal by the gain signal to generate the processed signal;

an audio amplifier, coupling to the audio processor, and amplifying the processed signal to generate an amplified signal;

a USB port, receiving an audio signal;

a USB controller, coupling to the USB port and the audio processor, and receiving the audio signal to generate the data signal; and an input device coupling to the USB controller, wherein the volume control signal is inputted to the audio processing system via the input device, wherein the reference signal is selected from the data signal.

2. The audio processing system as claimed in claim 1, wherein the processed signal works as the feedback signal.

3. The audio processing system as claimed in claim 1 further comprising at least one loudspeaker coupling to the audio amplifier to play the amplified signal.

4. The audio processing system as claimed in claim 1, wherein the input device is a keyboard, an input faceplate of a keyboard, or a remote control.

5. The audio processing system as claimed in claim 1 further comprising a Serial Interface Engine coupling to the USB controller, wherein the Serial Interface Engine decodes the audio signal and converts the received data from a serial form into a parallel form, converts the transmitted data from the parallel form to the serial form and encodes the converted transmitted data, and checks data by a Cyclic Redundancy Check Code when receiving/transmitting data.

6. The audio processing system as claimed in claim 5 further comprising a noise elimination circuit coupled to a Serial Interface Engine.

7. The audio processing system as claimed in claim 6, wherein the noise elimination circuit comprises a flip-flop and at least one digital-analog converter.

8. The audio processing system as claimed in claim 1, wherein the audio amplifier is a Class-D amplifier.

9. The audio processing system as claimed in claim 8, wherein the audio amplifier comprises a positive input terminal receiving a sawtooth wave and a negative input terminal receiving the processed signal, and amplifying the processed signal according to the sawtooth wave to generate the amplified signal.

10. The audio processing system as claimed in claim 1, wherein the operational amplifier is a differential operational amplifier.

11. The audio processing system as claimed in claim 1 further comprising a timepiece coupling to the audio processor.

12. The audio processing system as claimed in claim 11 further comprising a monitor, coupling to the audio processor and the timepiece and displaying the information of the audio processing system.

* * * * *